(12) United States Patent
Boerstler et al.

(10) Patent No.: US 7,171,318 B2
(45) Date of Patent: Jan. 30, 2007

(54) PLL FILTER LEAKAGE SENSOR

(75) Inventors: David William Boerstler, Round Rock, TX (US); Eskinder Hailu, Austin, TX (US); Kazuhiko Miki, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 10/870,533

(22) Filed: Jun. 17, 2004

(65) Prior Publication Data

US 2005/0280406 A1    Dec. 22, 2005

(51) Int. Cl.
 *G01R 19/00* (2006.01)
(52) U.S. Cl. ............... 702/64; 702/106; 455/180.3
(58) Field of Classification Search ............ 702/64, 702/69, 75, 81, 106, 118, 119, 121, 123, 124, 702/125, 182, 183, 184; 370/228; 327/157; 455/180.3
See application file for complete search history.

(56) References Cited

U.S. PATENT DOCUMENTS 5,648,964 A * 7/1997 Inagaki et al. ............ 370/228
6,832,173 B1 * 12/2004 Starr et al. .................. 702/106
6,919,746 B2 * 7/2005 Suzuki ........................ 327/157

* cited by examiner

Primary Examiner—Marc S. Hoff
Assistant Examiner—Mohamed Charloui
(74) Attorney, Agent, or Firm—Carr LLP; Diana R. Gerhardt

(57) ABSTRACT

The present invention provides a method, apparatus, and computer program for measuring the current leakage in a Low Pass Filter (LPF) capacitor of a Phased Locked Loop (PLL). As a result of thinner and thinner film capacitors in Complementary Metal-Oxide Semiconductor (CMOS) technology, leakage current, which causes a PLL to drift out of phase lock, has become an increasingly difficult problem. To overcome the leakage current problems, knowing the leakage current of an LPF capacitor is important to implement the correction circuitry. In the present invention, an external interface and a time interface analyzer are used to charge the LPF capacitor and measure the output frequency of the PLL's Voltage Controlled Oscillator. Because of the change in the output frequency, the leakage current can be determined.

19 Claims, 3 Drawing Sheets

PLL FILTER LEAKAGE SENSOR

FIELD OF THE INVENTION

The present invention relates generally to Complementary Metal-Oxide Semiconductor (CMOS) technology, and more particularly, to measuring device current leakage for a capacitor for a Phased Locked Loop (PLL).

DESCRIPTION OF THE RELATED ART

Phased Locked Loops (PLLs) are common components utilized in a variety of applications. For example, Frequency Modulation (FM) and Amplitude Modulation (AM) modulators utilize PLLs. PLLs operate by locking onto a phase and frequency of an input signal through continual adjustment of an oscillator. The PLL oscillator can be current or voltage driven. Typically, though, the PLL oscillator is a Voltage Controlled Oscillator (VCO).

Referring to FIG. 1 of the drawings, the reference numeral 100 generally designates a conventional PLL. A conventional PLL comprises a Phase-Frequency Detector (PFD) 102, a charge pump 104, a Low Pass Filter (LPF) 106, a VCO 108, and a frequency divider 110.

The illustration of the components of the PLL, though, do not necessarily lend to a complete explanation. The LPF 106 further comprises a capacitor 116 and a resistor 118 which operate on the principle of capacitive impedance where impedance of a capacitor is inversely proportional to the signal frequency. Also, the charge pump 104 further comprises a first current source 105, a second current source 107, a first switch 112, and a second switch 114.

The PLL 100 operates by maintaining charge on the first capacitor 116 of the LPF 106. A reference signal or input signal is input into the PFD 102 through a first node 122 along with feedback from the frequency divider 110 through a second node 132. Based on the comparison between the inputted signals, the PFD 102 can activate the first switch 112 of the charge pump 104 through a third node 124, which adds charge to the capacitor 116 of the LPF 106. The PFD 102 can also activate the second switch 114 of the charge pump 104 through a fourth node 126, which removes charge from the capacitor 116 of the LPF 106. Also, based on the comparison between the inputted signals, the PFD 102 may not provide an activation signal in order to place the charge pump into a high impedance state, which maintains the level of charge on the capacitor 116 of the LPF 106.

The active pulling down and pulling up the charge of the capacitor effectively changes the voltage of the LPF 106 because of the capacitive relationship between charge and voltage. The voltage of the LPF 106 is then used to control the voltage of the frequency and phase of the VCO 108. The voltage of the LPF 106 is maintained at the fifth node 128, which is input into the VCO 108. The VCO 108 then outputs an output signal through a sixth node 130 that has its phase and frequency synchronized with the input signal. The output signal from the VCO 108 is input into the frequency divider 110. Also, the output signal of VCO 108 is used in a variety of circuits to perform a variety of tasks.

With a conventional PLL 100 of FIG. 1, though, there are some disadvantages. Due to the advancement of CMOS technology, the resulting thickness of the dielectric of the capacitor 116 of FIG. 1 has become increasingly smaller. As a result of decreasing thickness of the dielectric, there has been an increase in the leakage current across the capacitor 116 of FIG. 1. The PLL, then cannot maintain, the proper voltage for the VCO 108 of FIG. 1 resulting in drift of the locked in phase and frequency.

Therefore, there is a need for a method and/or apparatus for measuring of leakage voltage in a PLL that addresses at least some of the problems associated with conventional methods and apparatuses for measuring current leakages in a PLL.

SUMMARY OF THE INVENTION

The present invention provides a method, an apparatus, and a computer program for measuring leakage current in a PLL. To measure the leakage current of a LPF capacitor the PFD is bypassed. Once the PFD is bypassed, the PLL's charge pump is employed to charge the LPF capacitor. As a result of the charge placed on the LPF capacitor, an output frequency based on the LPF voltage can be generated. Then, based on the output frequency, the leakage current can be determined.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
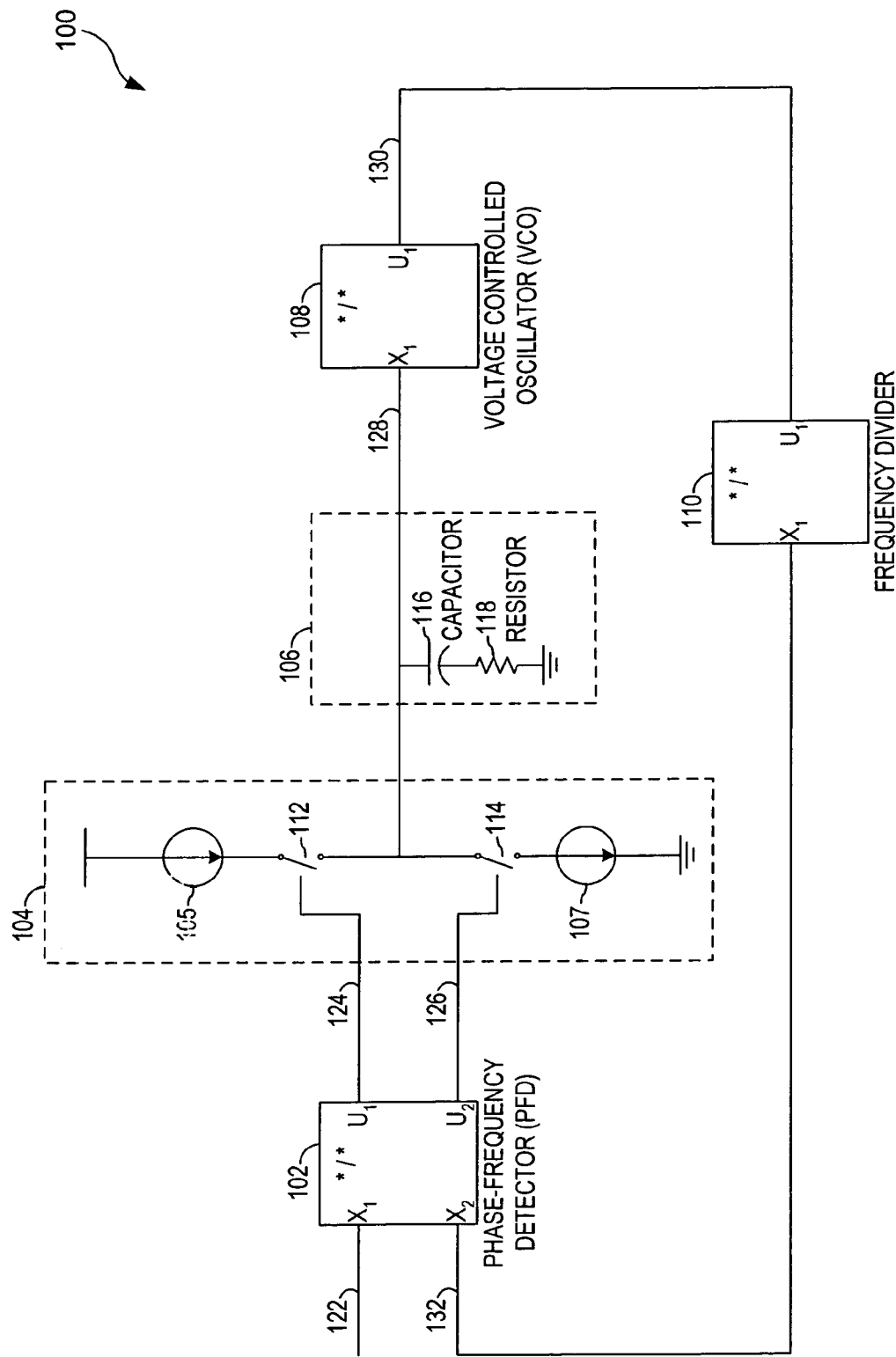
FIG. 1 is a block diagram depicting a conventional PLL.
Figure 2:
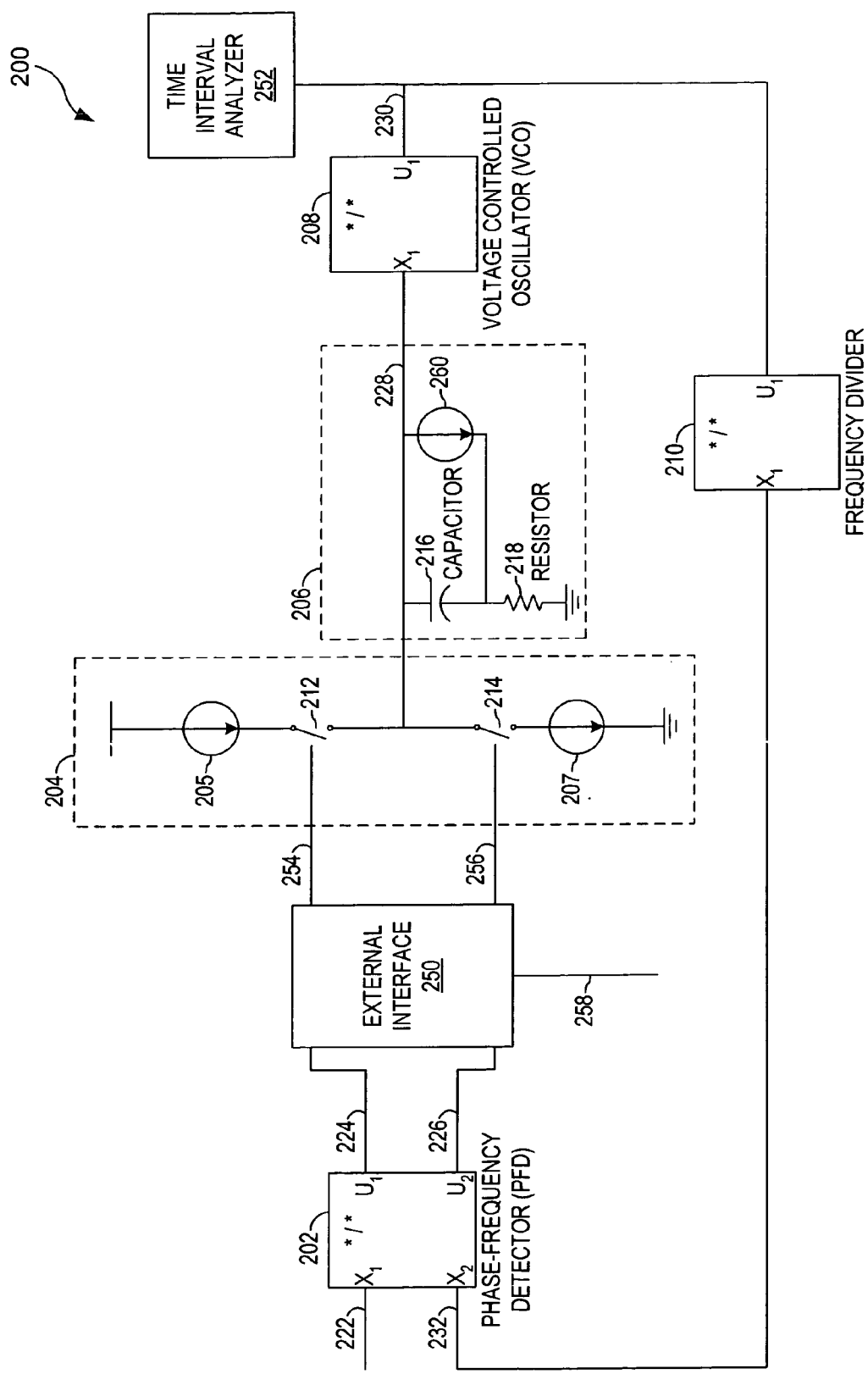
FIG. 2 is a block diagram depicting a PLL with a current leakage sensor capability.

Referring to FIG. 2 of the drawings, the reference numeral 200 generally designates a PLL with a filter leakage sensor capability. The PLL comprises a PFD 202, a charge pump 204, an LPF 206, a VCO 208, a frequency divider 210, an external interface 250, and a time interval analyzer 252.

The illustration of the components of the PLL, though, do not necessarily lend to a complete explanation. The LPF 206 further comprises a capacitor 216 and a resistor 218 which operate on the principle of capacitive impedance where impedance of a capacitor is inversely proportional to the signal frequency. Associated with the capacitor 216 is a leakage current 260. Additionally, there can be parasitic capacitances within the VCO 208 (not shown) and along a first node 228 (not shown). Also, the charge pump 204 further comprises a first current source 205, a second current source 207, a first switch 212, and a second switch 214.

The addition of the external interface 250 and the time interval analyzer 252, though, does not affect the operation of the PLL 200. The external interface 250 is a component of the PLL 200, allowing for external circuitry to interface the PLL 200. The time interval analyzer 252 is, however, external to the PLL 200 and not "designed into" the PLL 200. Essentially, the external interface 250 and the time interval analyzer 252 are employed as test equipment for the PLL 200 to sense the leakage current across the capacitor 216. Therefore, under normal operation, the external interface 250 and the time interval analyzer 252 are effectively bypassed.

During normal operation, the PLL 200 operates by maintaining charge on the first capacitor 216 of the LPF 206. A reference signal or input signal is input into the PFD 202 through a second node 222 along with feedback from the frequency divider 210 through a third node 232. Based on the comparison between the inputted signals, the PFD 202 can activate the first switch 212 of the charge pump 204 through a fourth node 224 and a fifth node 254, which add charge to the capacitor 216 of the LPF 206. The PFD 202 can also activate the second switch 214 of the charge pump 204 through a sixth node 226 and a seventh node 256, which removes charge from the capacitor 216 of the LPF 206. Also, based on the comparison between the inputted signals, the PFD 202 may not provide an activation signal in order to place the charge pump into a high impedance state, which maintains the charge on the capacitor 216 of the LPF 206.

The active pulling down and pulling up the charge of the capacitor effectively changes the voltage of the LPF 206 because of the capacitive relationship between charge and voltage. The voltage of the LPF 206 is then used to control the voltage of the frequency and phase of the VCO 208. The voltage of the LPF 206 is maintained at the first node 228, which is input into the VCO 208. The VCO 208 then outputs an output signal through an eighth node 230. The output signal from the VCO 208 is input into the frequency divider 210 through the eighth node 230, which has its phase and frequency synchronized with the input signal.

Intermediate the PFD 202 and the charge pump 204, however, is the external interface 250. The external interface 250 receives activation signals from the PFD 202 through the fourth node 224 and sixth node 226. Under normal operations, the external interface 250 is essentially bypassed so that the voltage level at the fourth node 224 is effectively equal to the voltage level at the fifth node 254. Also, while under normal operating conditions, the voltage level at the sixth node 226 is effectively equal to the voltage level at the seventh node 256.

During a test state, though, the external interface is not bypassed. Control signals can be communicated to and from the external interface 250 to external test circuitry (not shown) through a bus 258. Charge can then be placed on and removed from the capacitor 216 of the LPF 206 by providing activation signals through the fifth node 254 and the seventh node 256, respectively. Then based on the output characteristics of the VCO 208, which are monitored by the test interval analyzer 252 at the eighth node 230, the charge leakage and PLL 200 characteristics can be determined.

Figure 3:
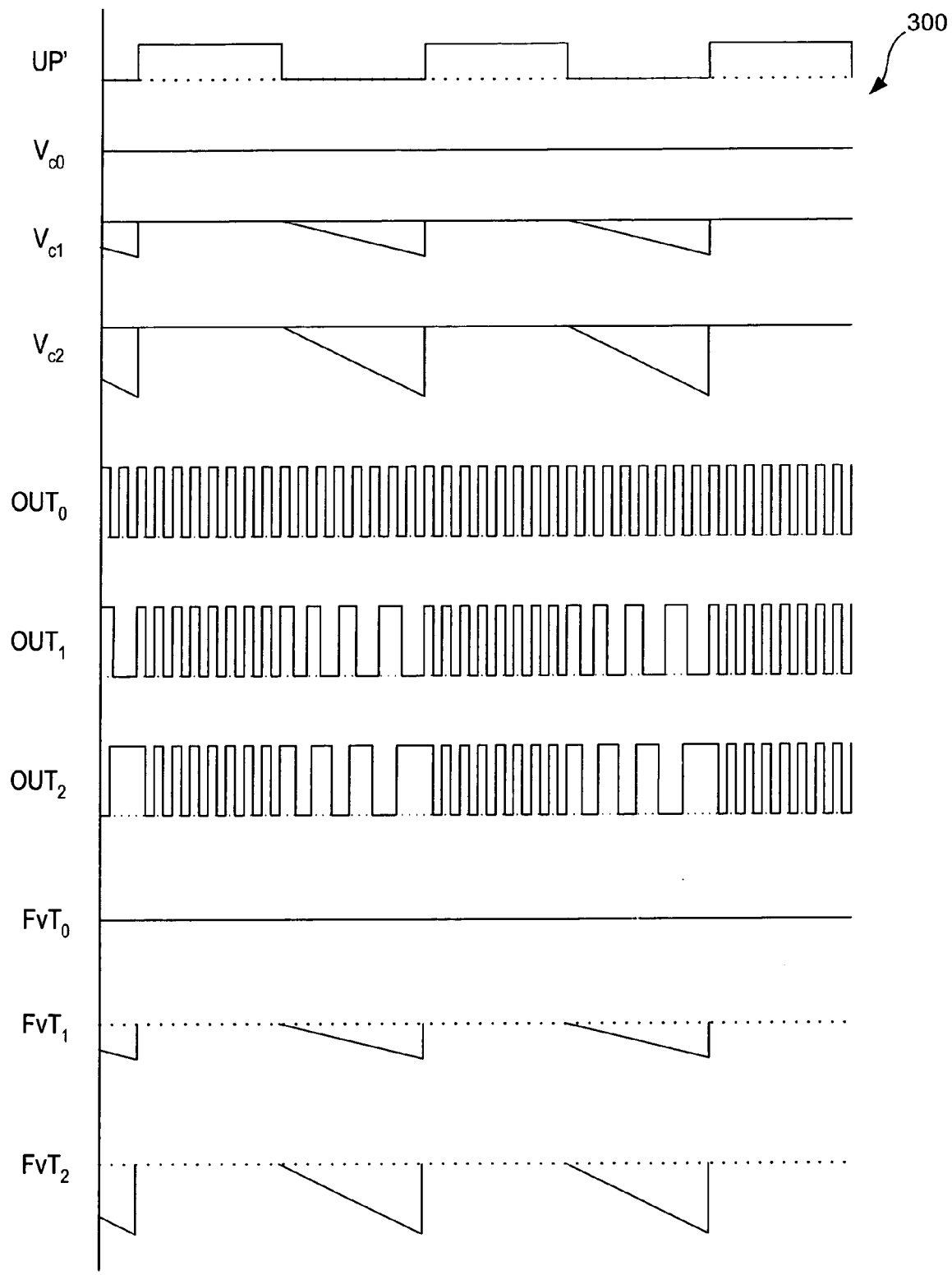
FIG. 3 is a timing diagram depicting the operation of current leakage sensor.

Testing the characteristics of the PLL 200, then requires specific operations of the PLL 200. Referring to FIG. 3, reference numeral 300 generally designates a timing diagram depicting the functionality of the PLL 200 under test conditions. Specifically, FIG. 3 is a characterization of charge up signal UP', which is accomplished through the activation of the first switch 212 of the charge pump 204 by providing an activation signal through the fifth node 254. However, the functionality of the charge down signal could also be depicted. The operation of the leakage sensor utilizing the charge down signal would be substantially similar to the functionality of the charge sensor utilizing a charge up signal whereby a well-defined initial voltage condition can be placed on the capacitor. Under the conditions of FIG. 3, however, the PLL 200 is effectively charged up to determine the leakage characteristics.

Under ideal conditions, there would not be any current leakage as a result of the thin films utilized in the LPF 206, as well as some other factor. Consequently, the voltage $V_{c0}$ on the capacitor 216 of the LPF 206 would be constant, as shown. As a result, once charged, the output $OUT_0$ of the VCO 208 would remain constant, as shown, and there would not be any frequency change versus time $FvT_0$ under ideal conditions, as shown.

However, due to the leakage that does occur as a result of physical conditions, voltages across the capacitor 216 of the LPF 206 do not remain constant. After the capacitor 216 of the LPF 206 is recharged during a refresh of the charge up UP' signal, the voltages across the capacitor 216 diminishes. A capacitor 216 with a first leakage current has a first voltage $V_{c1}$. A capacitor 216 with a second leakage current has a second voltage $V_{c2}$. Between refreshed of the charge up UP' signal, the voltages decrease. Because of the sharper decline in voltage between refreshes of the charge up UP', the second leakage current associated with the second voltage $V_{c2}$ is greater than the first leakage current associated with the first voltage $V_{c1}$.

However, making the determination of the leakage current requires the monitoring of the output of the VCO 208. Between refreshes of the charge up UP', there are frequency changes in the output of the VCO 208. There is a less drastic decrease in the output $OUT_1$ for the capacitor 216 with the first leakage current, than the output $OUT_2$ of the capacitor 218 with the second leakage current. As a result of the frequency changes, the time interval analyzer 252 can determine frequency versus time for the capacitor 216 with a first leakage current $FvT_1$ and for the capacitor 216 with a second leakage current $FvT_2$.

Once a determination of the rate of change of the frequency for the capacitor is measured, the respective leakage current can be determined. The rate of change of the frequency is the instantaneous slope of the frequency versus time curve, which can be measured. Also, there is a mathematical relationship between the rate of change of the frequency, the total capacitance ($C_t$), which includes any parasitic capacitances, the gain of the VCO 208 ($k_0$), and leakage current ($I_{Leak}$), which is as follows:

$$\frac{df}{dt} = \frac{k_0 I_{Leak}}{C_t} \qquad (1)$$

Also, the gain ($k_0$) of the VCO 208 is the derivative of the output frequency f with respect to voltage v, which is as follows:

$$k_0 = \frac{df}{dv} \quad (2)$$

Therefore, the relative leakage current of a PLL, such as the PLL 200 of FIG. 2, can be determined under real world conditions. Utilizing the external interface 250 of FIG. 2 and the time interval analyzer 252 of FIG. 2, there are no other compensating circuits. Any potential, extraneous circuitry that may cause the leakage current to vary is eliminated. Hence, a measurement of the leakage current for a PLL can be accurately determined to allow a designer to design the proper correction circuitry.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for measuring leakage current, comprising:
   a Phase Locked Loop (PLL) at least employing a Phase-Frequency Detector (PFD), a Voltage Controlled Oscillator (VCO), and a Low Pass filter (LPF);
   an external interface, wherein the external interface is at least configured to bypass the PFD when measuring leakage current of the LPF, and wherein the external interface is at least configured to provide charge to an LPF capacitor;
   a time interval analyzer, wherein the time interval analyzer is at least configured to measure an output frequency of the VCO versus time once the LPF capacitor is charged; and
   wherein bypassing the PFD reduces interference while measuring leakage current of the LPF.

2. The apparatus of claim 1, wherein the PLL further comprises a charge pump that at least provides positive charge.

3. The apparatus of claim 2, wherein the external interface is configured to employ the charge pump to provide charge to the LPF capacitor.

4. The apparatus of claim 1, wherein the PLL further comprises a charge pump that at least provides negative charge.

5. The apparatus of claim 4, wherein the external interface is configured to employ the charge pump to provide charge to the LPF capacitor.

6. The apparatus of claim 1, wherein the external interface is at least configured to be computer controlled.

7. The apparatus of claim 1, wherein the LPF capacitor has an associated leakage current.

8. A method for measuring leakage current in a PLL, comprising:
   bypassing a PFD through the use of an external interface;
   once the PFD is bypassed, charging an LPF capacitor;
   generating an output frequency based on the LPF voltage; and
   determining the leakage current based on the output frequency, wherein bypassing the PFD reduces interference while determining the leakage current of the LPF.

9. The method of claim 8, wherein the step of determining the output further comprises employing a time interval analyzer.

10. The method of claim 8, wherein the step of bypassing further comprises:
    receiving a disable signal at the external interface from external circuitry; and
    disabling the path between the PFD and a charge pump.

11. The method of claim 8, wherein the step of determining flirt her comprises:
    measuring the output frequency at a plurality of predetermined intervals;
    calculating a rate of change of the output frequency; and
    determining the leakage current from the rate of change of the output frequency.

12. A computer-readable medium having a computer program product for measuring leakage current in a PLL, the computer program product comprising:
    computer code for bypassing a PFD through the use of an external interface;
    once the PFD is bypassed, computer code for charging an LPF capacitor;
    computer code for generating an output frequency based on the LPF voltage; and
    computer code for determining the leakage current based on the output frequency, wherein bypassing the PFD reduces interference while determining the leakage current of the LPF.

13. The computer-readable medium according to claim 12, wherein the computer code for determining the output further comprises computer code for employing a time interval analyzer.

14. The computer-readable medium according to claim 12, wherein the computer code for bypassing further comprises:
    computer code for receiving a disable signal at the external interface from external circuitry; and
    computer code for disabling the path between the PFD and a charge pump.

15. The computer-readable medium according to claim 12, wherein the computer code for determining further comprises:
    computer code for measuring the output frequency at a plurality of predetermined intervals;
    computer code for calculating a rate of change of the output frequency; and
    computer code for determining the leakage current from the rate of change of the output frequency.

16. A processor for measuring leakage current in a PLL, the processor including a computer program product comprising:
   computer code for bypassing a PFD through the use of an external interface;
   once the PFD is bypassed, computer code for charging an LPF capacitor;
   computer code for generating an output frequency based on the LPF voltage; and
   computer code for determining the leakage current based on the output frequency, wherein bypassing the PFD reduces interference while determining the leakage current of the LPF.

17. The processor according to claim 16, wherein the computer code for determining the output further comprises computer code for employing a time interval analyzer.

18. The processor according to claim 16, wherein the computer code for bypassing further comprises:
   computer code for receiving a disable signal at the external interface from external circuitry; and
   computer code for disabling the path between the PFD and a charge pump.

19. The processor according to claim 16, wherein the computer code for determining further comprises:
   computer code for measuring the output frequency at a plurality of predetermined intervals;
   computer code for calculating a rate of change of the output frequency; and
   computer code for determining the leakage current from the rate of change of the output frequency.

* * * * *